(12) United States Patent
Subramanian et al.

(10) Patent No.: US 6,383,952 B1
(45) Date of Patent: May 7, 2002

(54) RELACS PROCESS TO DOUBLE THE FREQUENCY OR PITCH OF SMALL FEATURE FORMATION

(75) Inventors: Ramkumar Subramanian, Sunnyvale; Bhanwar Singh, Morgan Hill; Marina V. Plat, San Jose; Christopher F. Lyons, Fremont; Scott A. Bell, San Jose, all of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/794,632

(22) Filed: Feb. 28, 2001

(51) Int. Cl.[7] .............................................. H01L 21/31
(52) U.S. Cl. ........................................ 438/781; 438/780
(58) Field of Search ................................. 438/780, 781, 438/283, 694, 759

(56) References Cited

U.S. PATENT DOCUMENTS 6,033,952 A * 3/2000 Yasumura et al. .......... 438/253

OTHER PUBLICATIONS

L.J. Peters, "Resist Join the Sub–λ Revolution", Semiconductor International, 1999, pp. 1–7 Cahners Business Information, A Division of Reed Elsevier, Inc.

T. Toyoshima et al., "0.1 μm Level Contact Hole Pattern formation with KrF Lithography by Resolution Enhancement Lithography Assisted by Chemical Shrink (RELACS)", IEEE, pp. 12.5.1–12.5.4, 1998 Advanced Technology R&D Ctr., Mitsubishi Electric Corp.

* cited by examiner

Primary Examiner—Alexander G. Ghyka
(74) Attorney, Agent, or Firm—Foley & Lardner

(57) ABSTRACT

A method of doubling the frequency of small pattern formation. The method includes forming a photoresist layer, and then patterning it. A RELACS polymer is spread over the patterned photoresist layer. Portions of the RELACS polymer on top portions of each patterned photoresist region are removed, by either etching or by polishing them off. Portions between each patterned photoresist region are also removed in this step. The patterned photoresist regions are removed, preferably by a flood exposure and then application of a developer to the exposed photoresist regions. The remaining RELACS polymer regions, which were disposed against respective sidewalls of the patterned photoresist regions, prior to their removal, are then used for forming small pattern regions to be used in a semiconductor device to be formed on the substrate. These small pattern regions can be used to form separate poly-gates.

10 Claims, 1 Drawing Sheet

RELACS PROCESS TO DOUBLE THE FREQUENCY OR PITCH OF SMALL FEATURE FORMATION

BACKGROUND OF THE INVENTION

1. Field of the Invention

This invention relates generally to forming small critical dimension patterns on a layer by using a RELACS polymer. In particular, this invention relates to forming small patterns by forming a RELACS polymer around a photoresist, removing portions of the RELACS polymer, and then removing the photoresist, to thereby form the small patterns by use of the remaining RELACS polymer.

2. Description of the Related Art

As critical dimensions (CD) in semiconductor device fabrication get smaller and smaller, so too do the dimensions for forming patterns, such as separate poly-gates, on a semiconductor substrate. For example, obtaining poly-gates having a CD (e.g., width) of 100 nanometers or less, will soon be required for forming semiconductor devices.

Conventional photolithography techniques for forming small CD poly-gates are reaching limitations due to the small CD required for current semiconductor device fabrication. Conventionally, a photoresist (in this case, a positive photoresist) is provided on a substrate, and then a particular pattern is formed by exposing certain portions of the photoresist using a mask. The exposed portions of the photoresist are then removed by subjecting the photoresist to a developer solution, thereby rendering the exposed portions of the photoresist soluble.

The patterned photoresist is then used as a hard mask, in order to form patterns, such as one or more poly-gates. The problem with this technique is that the masks required for forming very small poly-gates may have inaccuracies due in part to light diffraction problems (e.g., Rayleigh diffraction limit), focus problems, and the small CDs required for forming the very small patterns.

Therefore, a better technique for forming very small patterns is desired.

SUMMARY OF THE INVENTION

According to an embodiment of the invention, there is provided a method for doubling the pitch of a given feature and simultaneously forming small patterns on a semiconductor substrate. The method includes a step of forming a photoresist layer on the substrate. The method also includes a step of patterning the photoresist layer. The method further includes a step of spreading a RELACS polymer on the patterned photoresist layer. The method also includes the step of polishing or etching back a portion of the RELACS polymer, to leave the RELACS polymer only on sidewalls of each patterned portion of the patterned photoresist layer. The method still further includes the step of removing the patterned photoresist layer, whereby the RELACS polymer on is the sidewalls remain, to thereby form a polysilicon pattern on the substrate.

BRIEF DESCRIPTION OF THE DRAWINGS

The embodiments of the present invention will become more fully apparent from the following detailed description when read in conjunction with the accompanying drawings with like reference numerals indicating corresponding parts throughout, wherein.

DETAILED DESCRIPTION OF THE PREFERRED EMBODIMENTS

Details of the present invention will be described below with reference to the drawings. In the present invention, a RELACS polymer is utilized for doubling the pitch and also providing very small patterns in a semiconductor device fabrication, according to an embodiment of the invention. These very small patterns can be as small as 30 to 150 nanometers, which is useful for forming current and next generation semiconductor devices.

In embodiments of the invention, by coating a patterned photoresist with a RELACS polymer, the number of separate patterns can be formed with a doubled frequency or a doubled pitch with respect to each patterned portion of the photoresist. That is, for each separate patterned photoresist portion, a first RELACS polymer region is formed on one sidewall of each separate patterned photoresist portion, and a second RELACS polymer region is formed on an opposite sidewall of each separate patterned photoresist portion.

A RELACS polymer is an organic component that is used in semiconductor device fabrication. See, for example, an article entitled "Resists Join the Sub-Lambda Revolution," by Laura J. Peters, published in Semiconductor International, September, 1999, which is incorporated in its entirety herein by reference. This article describes a process used by Mitsubishi, for shrinking KrF-imaged via holes from 0.2 μm to 0.1 μm using a coat, bake and rinse sequence following resist patterning. This article also states that Clariant AZ licenses the material and commercializes it as RELACS (resist enhancement lithography assisted by chemical shrink) using R200 coating and R2 developer, with solutions also available for i-line.

Figure 1:
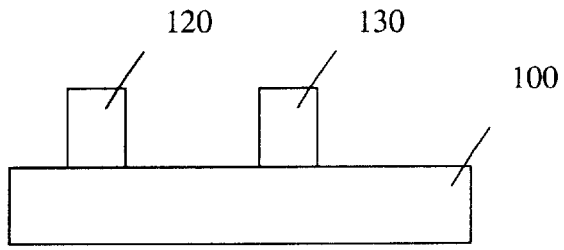
FIG. 1 shows a patterned photoresist formed on a substrate, according to an embodiment of the invention.

The present invention utilizes the RELACS polymer in a different way than how it is used in conventional semiconductor device fabrication, to be explained in more detail below. Another example of a conventional use of a RELACS polymer is described in "0.1 um Level Contact Hole Pattern Formation with KrF Lithography by Resolution Enhancement Lithography Assisted by Chemical Shrink (RELACS)", by T. Toyoshima et al., September 1998, published by IEEE, which is incorporated in its entirety herein by reference. Referring now to FIG. 1, a photoresist layer is formed on an underlayer 100 (that is formed on a not shown substrate, or that may itself correspond to the substrate), and patterned by conventional methods. In FIG. 1, only a first photoresist pattern portion 120 and a second photoresist pattern portion 130 are shown, for ease in explanation.

Figure 2:
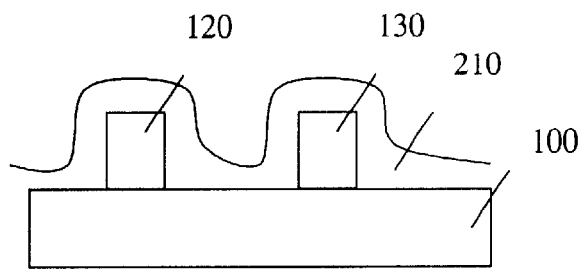
FIG. 2 shows a RELACS polymer spread on the patterned photoresist layer, according to an embodiment of the invention.

After the photoresist layer has been patterned, RELACS polymer is spread onto and around the photoresist pattern portions 120, 130. This results in a RELACS polymer layer 210, as shown in FIG. 2, which is formed around each of the photoresist pattern portions 120, 130. The preferred method for spreading the RELACS polymer onto the underlayer 100 and onto the photoresist pattern portions 120, 130 is by spin coating. Other ways of spreading the RELACS polymer may be contemplated, while remaining within the scope of the invention. For example, a spray coat process may be used to apply the RELACS polymer onto the patterned photoresist portions 120, 130 and onto the underlayer 100.

Figure 3:
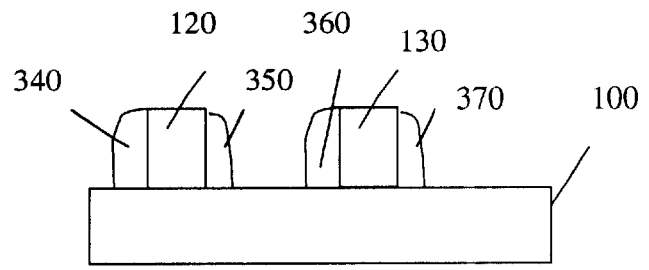
FIG. 3 shows the RELACS polymer after it has been etched or polished, to remove portions of the RELACS polymer between patterned portions of the photoresist and above a top surface of each of the patterned portions of the photoresist, according to an embodiment of the invention.

When the RELACS polymer has been spread onto the patterned photoresist portions 120, 130, whereby it coats and thereby covers the patterned photoresist portions 120, 130, the RELACS polymer will bond with the patterned photoresist portions 120, 130. This bonding takes place on the top surface as well as the sidewalls of the patterned photoresist portions 120, 130. This bonding is believed to be due to crosslinking of the RELACS polymer with the sidewalls. Referring now to FIG. 3, the portions of the RELACS polymer layer 210 on the top surface of the patterned photoresist portions 120, 130, as well as the portions of the RELACS polymer layer 210 on the underlayer 100 below the patterned photoresist portions 120, 130, are removed. This removal may is performed by a blanket etch in a first embodiment of the invention. The blanket etch removes the portions of the RELACS polymer layer 210 on the top surfaces of the patterned photoresist portions 120, 130, as well as top portions of the sidewall portions of the RELACS polymer layer 210 that are bonded to the sidewalls of the patterned photoresist portions 120, 130. Preferably, the blanket etch is an anisotropic etch.

What remains after the blanket etch is portions of the RELACS polymer layer 210 that are disposed against the sidewalls of each of the patterned photoresist portions 120, 130. The time frame for this blanket etch is dependent on the thickness of the RELACS polymer that has been coated onto the patterned photoresist layer. For example, for a 1000 angstrom thick RELACS polymer layer, a blanket etch using oxygen plasma as an etchant would remove the portions of the RELACS polymer layer that are disposed on the top surfaces of the photoresist portions 120, 130, while removing only a small percentage (e.g., less than 10%) of the (bonded) sidewall portions of the RELACS polymer layer.

In a second embodiment of the invention, the removal of the portions of the RELACS polymer layer 210 is performed by polishing off the portions of the RELACS polymer layer 210 on the top surface of the patterned photoresist portions 120, 130, as well as polishing off the portions of the RELACS polymer layer 210 between the patterned photoresist portions 120, 130 (that are not in contact with the sidewalls of the patterned photoresist portions 120, 130). For example, a chemical and mechanical polishing (CMP) process may be performed for polishing off the portions of the RELACS polymer layer on the top portions of the patterned photoresist portions 120, 130, and on the underlayer 100.

Once the etching or polishing step is complete, what remains is a first RELACS polymer portion 340 and a second RELACS polymer portion 350 that are respectively disposed against the left and right sidewalls of the patterned photoresist portion 120, as well as a third RELACS polymer portion 360 and a fourth RELACS polymer portion 370 that are respectively disposed against the left and right sidewalls of the patterned photoresist portion 130 (see FIG. 3).

The widths of these first through fourth RELACS polymer portions 340, 350, 360, 370 are very small, on the order of 30 nanometers to 150 nanometers. The size of these portions can be controlled by controlling the time in which the RELACS polymer is spread over the patterned photoresist layer, in that a longer spreading time results in wider RELACS polymer sidewall portions. As seen in FIG. 3, the first and second RELACS polymer portions 340, 350 form spacers with respect to the first patterned photoresist portion 120, and the third and fourth RELACS polymer portions 360, 370 form spacers with respect to the second patterned photoresist portion 130.

Figure 4:
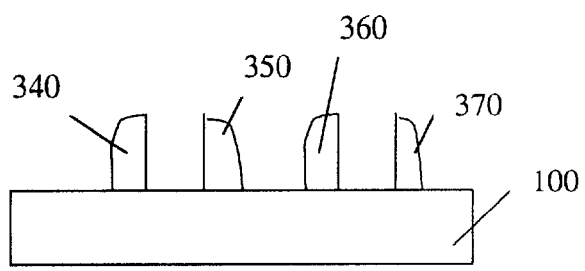
FIG. 4 shows the RELACS polymer remaining on the substrate, after the patterned photoresist has been removed, according to an embodiment of the invention, thus showing the doubling of the frequency or pitch and also showing the small features formed by the remaining RELACS polymer on the substrate.

FIG. 4 shows the semiconductor substrate after a flood light exposure is provided to the patterned photoresist portions 120, 130, after the semiconductor substrate is subjected to a developer solution. The exposure and developer processes results in removal of the patterned photoresist portions 120, 130, in a manner that is similar to how photoresist layers are removed in conventional methods.

What remains on the semiconductor substrate are the first through fourth RELACS polymer portions 340, 350, 360, 370, which are unaffected by the flood exposure and developer solution. These first through fourth RELACS polymer portions 340, 350, 360, 370 serve as masks in subsequent semiconductor device fabrication processing, and may be used to form first through fourth poly-gate regions in particular locations, for a semiconductor device (or devices) formed on a substrate. For example, if a first polysilicon layer is disposed directly below the first through fourth RELACS polymer portions 340, 350, 360, 370, the first through fourth RELACS polymer portions 340, 350, 360, 370 can be used as masks in order to pattern the first polysilicon layer. In FIG. 4, the first polysilicon layer would correspond to layer 100 in that figure. These first through fourth RELACS polymer portions 340, 350, 360, 370 are smaller in width than the patterned photoresist portions 120, 130 that are provided in the process for forming these RELACS polymer portions.

While there has been illustrated and described what is at present considered to be preferred embodiments of the present invention, it will be understood by those skilled in the art that various changes and modifications may be made, and equivalents may be substituted for elements thereof without departing from the true scope of the invention. For example, a negative photoresist may be utilized instead of a positive photoresist (as described above), whereby the negative photoresist is patterned and removed as per conventional ways of doing so. Also, patterning of a polysilicon-1 or polysilicon-2 layer for purposes other than forming poly-gates, is within the scope of the present invention.

In addition, many modifications may be made to adapt a particular situation or material to the teachings of the invention without departing from the central scope thereof. Therefore, it is intended that this invention not be limited to the particular embodiments disclosed as the best mode contemplated for carrying out the invention, but that the invention will include all embodiments falling within the scope of the appended claims.

We claim:

1. A method for forming patterns having a small critical dimension on a substrate, comprising:
    forming a photoresist layer on the substrate;
    patterning the photoresist layer;
    spreading a polymer on the patterned photoresist layer;
    removing portions of the polymer, to provide the polymer only on sidewalls of each patterned portion of the patterned photoresist layer;
    removing the patterned photoresist layer and leaving the polymer previously disposed only on the sidewalls of said each patterned portion of the patterned photoresist layer still disposed on the substrate, wherein the polymer on the sidewalls are used for forming the patterns for a semiconductor device that is being formed on the substrate, wherein said polymer is formed by resolution enhancement lithography assisted by chemical shrink.

2. The method according to claim 1, wherein the first removing step is performed by blanket etching of the polymer.

3. The method according to claim 1, wherein the first removing step is performed by polishing of the polymer.

4. The method according to claim 1, wherein contact lines are formed on the sidewalls of said each patterned portion of the patterned photoresist layer.

5. The method according to claim 1, wherein the patterned photoresist layer is removed by flood exposure of the patterned photoresist layer, and then by providing a developer solution to the exposed patterned photoresist layer.

6. A method for doubling a frequency of pattern region formation on a substrate, comprising:

forming a photoresist layer on the substrate;

patterning the photoresist layer to form at least one contiguous photoresist portion:

spreading a polymer on the at least one contiguous photoresist portion;

removing portions of the polymer, to provide a first polymer portion on a first sidewall and a second polymer portion on a second sidewall of the at least one contiguous photoresist portion; and removing the at least one contiguous photoresist portion, wherein, first and second patterned regions, respectively corresponding to locations where the first and second polymer portions are located, are created as a result, and wherein said polymer is formed by resolution enhancement lithography assisted by chemical shrink.

7. The method according to claim 6, wherein the first removing step is performed by blanket etching of the polymer.

8. The method according to claim 6, wherein the first removing step is performed by polishing of the polymer.

9. The method according to claim 6, wherein, for every contiguous portion of the patterned photoresist layer, two polymer portions are provided, to be used as locations where two patterned regions are to be formed.

10. A method for doubling a frequency of pattern region formation on a substrate, comprising:

forming a photoresist layer on the substrate;

patterning the photoresist layer to form at least one contiguous photoresist portion;

spreading a polymer on the at least one contiguous photoresist portion;

removing portions of the polymer, to provide a first polymer portion on a first sidewall and a second polymer portion on a second sidewall of the at least one contiguous photoresist portion; and removing the at least one contiguous photoresist portion, wherein, first and second patterned regions, respectively corresponding to locations where the first and second polymer portions are located, are created as a result, wherein said polymer is formed by resolution enhancement lithography assisted by chemical shrink, wherein, for every contiguous portion of the patterned photoresist layer, two polymer portions are provided, to be used as locations where two patterned regions are to be formed, and wherein the two patterned regions respectively correspond to two poly-gates that are formed on the substrate.

* * * * *